United States Patent
Kim et al.

(10) Patent No.: US 8,988,964 B2
(45) Date of Patent: Mar. 24, 2015

(54) SEMICONDUCTOR MEMORY DEVICE AND REFRESH LEVERAGING DRIVING METHOD THEREOF

(71) Applicant: Samsung Electronics Co., Ltd., Suwon-Si, Gyeonggi-Do (KR)

(72) Inventors: Dae-Jeong Kim, Seoul (KR); Kabyong Kim, Suwon-si (KR); Kwang-Woo Lee, Suwon-si (KR); Heon Lee, Hwaseong-si (KR); Inho Cho, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/071,757

(22) Filed: Nov. 5, 2013

(65) Prior Publication Data
US 2014/0140154 A1    May 22, 2014

(30) Foreign Application Priority Data
Nov. 16, 2012    (KR) .......................... 10-2012-0130381

(51) Int. Cl.
| | | |
|---|---|---|
| G11C 7/22 | (2006.01) | |
| G11C 11/406 | (2006.01) | |
| G11C 16/34 | (2006.01) | |
| G11C 29/00 | (2006.01) | |

(52) U.S. Cl.
CPC ........ *G11C 11/40603* (2013.01); *G11C 11/406* (2013.01); *G11C 16/3418* (2013.01); *G11C 29/82* (2013.01); *G11C 2211/4063* (2013.01)
USPC ....... 365/222; 365/200; 365/230.06; 365/149

(58) Field of Classification Search
USPC .............................. 365/222, 200, 230.06, 149
See application file for complete search history.

(56) References Cited

U.S. PATENT DOCUMENTS

| | | | |
|---|---|---|---|
| 5,991,218 A | 11/1999 | Kushiyama | |
| 6,166,980 A | 12/2000 | Chun | |
| 6,434,064 B2 | 8/2002 | Nagai | |
| 6,707,730 B2 | 3/2004 | Mori et al. | |
| 6,894,942 B2 | 5/2005 | Cho | |
| 7,187,607 B2 | 3/2007 | Koshikawa | |
| 7,230,870 B2 | 6/2007 | Takai | |
| 7,336,550 B2 | 2/2008 | Lee | |
| 7,345,941 B2 | 3/2008 | Matsui | |
| 7,362,641 B2 * | 4/2008 | Morgan et al. | 365/222 |
| 7,602,659 B2 | 10/2009 | Kang | |
| 7,688,655 B2 | 3/2010 | Takai | |
| 7,719,906 B2 | 5/2010 | Tanimura et al. | |

(Continued)

FOREIGN PATENT DOCUMENTS

| | | |
|---|---|---|
| JP | 2000132963 A | 5/2000 |
| JP | 2005116106 A | 4/2005 |

(Continued)

*Primary Examiner* — Hoai V Ho
*Assistant Examiner* — Jay Radke
(74) *Attorney, Agent, or Firm* — Harness, Dickey & Pierce, P.L.C.

(57) ABSTRACT

A refresh leveraging driving method is provided which includes deciding a unit of word lines to be driven at a refresh leveraging operation to be the same as a redundancy repair row unit setting a lower row address of an input refresh leveraging address corresponding to the decided refresh leveraging row driving unit to a don't care state; and internally generating the don't care lower row address of the refresh leveraging address to drive word lines according to a combined refresh leveraging address.

14 Claims, 11 Drawing Sheets

(56) References Cited

U.S. PATENT DOCUMENTS

| | | |
|---|---|---|
| 8,072,827 B2 * 12/2011 | Wakimoto | 365/200 |
| 2006/0181947 A1 * 8/2006 | Morgan et al. | 365/222 |
| 2009/0161457 A1 * 6/2009 | Wakimoto | 365/200 |
| 2011/0292710 A1 12/2011 | Matsubayashi et al. | |
| 2012/0106277 A1 5/2012 | Kwean | |
| 2012/0134224 A1 5/2012 | Shim et al. | |

FOREIGN PATENT DOCUMENTS

| | | |
|---|---|---|
| KR | 1020050022394 A | 3/2005 |
| KR | 100833592 B1 | 5/2008 |
| KR | 1020080101149 A | 11/2008 |

\* cited by examiner

Fig. 4

| GRL-F1 | M | F1 | F0 | A14 | A13 | A12 | A11 | A10 | A9 | A8 | A7 | A6 | A5 | A4 | A3 | A2(1) | A1(0) | A0(0) | A |
| GRL-F2 | M | F1 | F0 | A14 | A13 | A12 | A11 | A10 | A9 | A8 | A7 | A6 | A5 | A4 | A3 | A2(1) | A1(0) | A0(1) | B |
| GRL-F3 | M | F1 | F0 | A14 | A13 | A12 | A11 | A10 | A9 | A8 | A7 | A6 | A5 | A4 | A3 | A2(1) | A1(1) | A0(0) | C |
| GRL-F4 | M | F1 | F0 | A14 | A13 | A12 | A11 | A10 | A9 | A8 | A7 | A6 | A5 | A4 | A3 | A2(1) | A1(1) | A0(1) | D |

Fig. 5

| GRL-F1 | M | F1 | F0 | A14 | A13 | A12 | A11 | A10 | A9 | A8 | A7 | A6 | A5 | A4 | A3 | A2 | A1/X | A0/X | A |

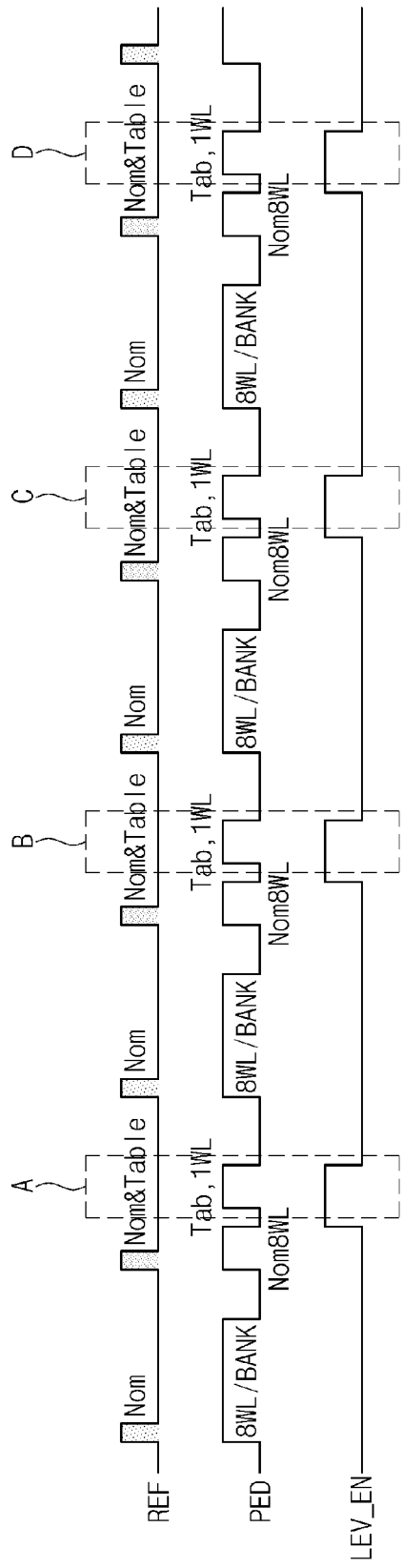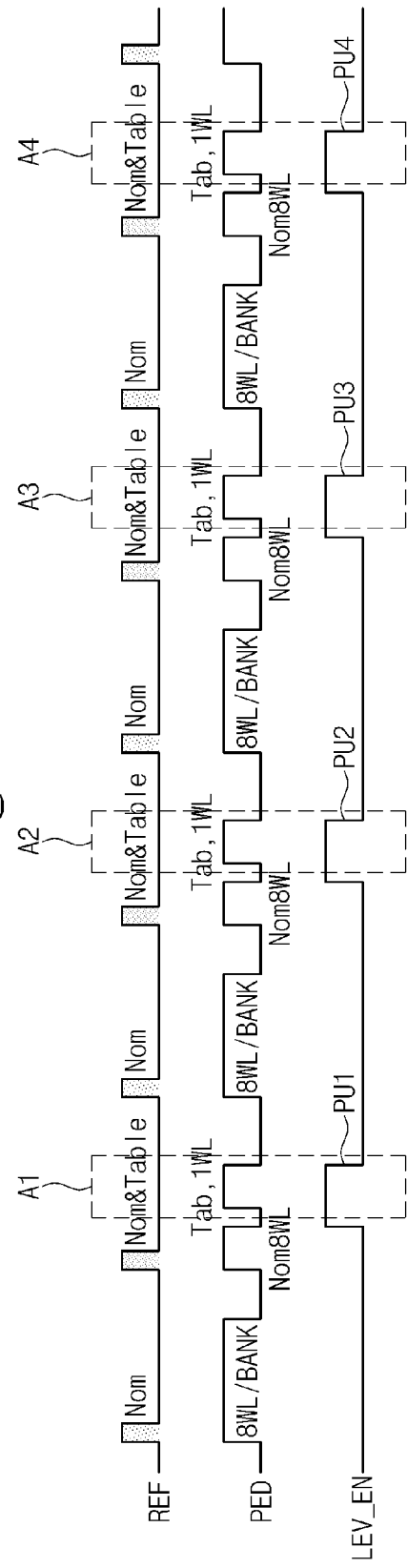

SEMICONDUCTOR MEMORY DEVICE AND REFRESH LEVERAGING DRIVING METHOD THEREOF

CROSS-REFERENCE TO RELATED APPLICATIONS

A claim for priority under 35 U.S.C. §119 is made to Korean Patent Application No. 10-2012-0130381 filed Nov. 16, 2012, in the Korean Intellectual Property Office, the entire contents of which are hereby incorporated by reference.

BACKGROUND

The inventive concepts described herein relate to a semiconductor memory, and more particularly, relate to a volatile semiconductor memory device and a refresh leveraging driving method thereof.

If at least one memory cell in a semiconductor memory device, such as a dynamic random access memory DRAM), is defective, the semiconductor memory device may not perform a required function normally. In this case, the semiconductor memory device may be discarded. However, discarding semiconductor memory devices due to a few defective memory cells is inefficient in terms of a yield.

A semiconductor memory device may include redundancy memory cells. When the semiconductor memory device includes defective memory cells, the defective memory cells may be replaced with the redundancy memory cells of the semiconductor memory device. In this case, the semiconductor memory device may continue to be used. This may mean that a yield may be improved.

A repair operation of a memory device using redundancy memory cells may be accomplished by replacing defective memory cells with redundancy memory cells by a row/column unit. If defective memory cells are detected at a test level after a wafer is processed, addresses of the defective memory cells may be replaced with addresses of redundancy memory cells. In the case that an address signal corresponding to a defective line is received, it may be provided to a spare line instead of the defective line. A row repair operation may be performed through a repair logic circuit, for example, by a unit of four word lines.

A general refresh leveraging (GRL) scheme for reinforcing the refresh ability may be applied to a semiconductor memory device (e.g., DRAM) to improve a data retention characteristic of a weak memory cell. Memory cells determined to be soft failed at a test level may be not repaired with redundancy memory cells but used as normal memory cells. Soft-failed memory cells, that is, weak memory cells may be specifically managed in comparison with normal memory cells. If the GRL scheme is used, weak memory cells may be refreshed more frequently in comparison with normal memory cells at a refresh mode of operation. In general, a GRL operation may be performed by a word line unit.

SUMMARY

According to example embodiments of the inventive concepts, a refresh leveraging driving method is provided. The method may comprise setting a unit of word lines of a refresh leveraging row driving unit to have the same number of word lines as a number of word lines of a redundancy repair row unit; setting a lower row address of an input refresh leveraging address to a don't care state, the lower row address corresponding to the refresh leveraging row driving unit; and generating the don't care lower row address of the refresh leveraging address to drive word lines according to a combined refresh leveraging address, the combined refresh leveraging address being formed of (i) a remaining address of the refresh leveraging address other than the don't care lower row address and (ii) an internally generated lower row address.

In example embodiments, if the redundancy repair row unit is formed of four word lines, the lower row address may be a 2-bit address.

In example embodiments, if the redundancy repair row unit is formed of eighth word lines, the lower row address may be a 3-bit address.

In example embodiments, the lower row address may be generated by a counting operation of an internal counter.

In example embodiments, the lower row address may be generated from a least significant bit address by sequentially incrementing the least significant bit address.

In example embodiments, the lower row address may be generated from a most significant bit address by sequentially decrementing the most significant bit address.

In example embodiments, the lower row address may be generated in an interleaving basis.

In example embodiments, the word lines may be driven in synchronization with a refresh leveraging enable signal.

In example embodiments, the input refresh leveraging address may be stored at an anti-fuse box.

According to another example embodiment of the inventive concepts, a semiconductor memory device is provided. The semiconductor memory device may comprise a memory cell array having a normal memory cell block and a redundancy memory cell block; a fuse box configured to store redundancy repair row address information for selecting redundancy memory cells in the redundancy memory cell block and refresh leveraging address information for selecting weak memory cells in the normal memory cell block; a counting unit configured to generate an internal address; a row decoder configured to select a word line unit of the memory cell array; and a control circuit configured to control the counting circuit and the row decoder. The word line unit may be set to be equal to a redundancy repair row unit when driven at a refresh leveraging operation, and a lower row address of an input refresh leveraging address corresponding to a refresh leveraging row driving unit is in a don't care state. The control circuit is configured to control the counting circuit to generate the don't care lower row address of the refresh leveraging address internally and control the row decoder to drive word lines according to a combined refresh leveraging address, the combined refresh leveraging address is formed of (i) the remaining address of the refresh leveraging address other than the don't care lower row address and (ii) a lower row address of the internal address generated by the counting circuit don't care don't care don't care.

In example embodiments, fuses of the fuse box storing the refresh leveraging address are anti-fuses.

In example embodiments, if the redundancy repair row unit is formed of four word lines, the lower row address may be a 2-bit address.

In example embodiments, the counting circuit may comprise a counter configured to generate the lower row address from a least significant bit address by sequentially incrementing the least significant bit address.

In example embodiments, a unit of word lines to be driven at the refresh leveraging operation is determined to be the same as a redundancy repair row unit, and the determination provides memory test processes that are tested simultaneously.

In example embodiments, the counter generates the lower row address in an interleaving basis.

According to another example embodiment, a method for driving a refresh leveraging operation of semiconductor memory device is provided. The method may comprise storing a redundancy repair row address and a refresh leveraging address; selecting a word line unit of a memory cell array of the semiconductor device, the word line unit being located at the stored refresh leveraging address, the word line unit having an equal number of word lines as a number of word lines of a redundancy repair row unit located at the stored redundancy repair row address, and a lower row address of an input refresh leveraging address corresponding to a refresh leveraging row driving unit is in a don't care state; and generating a don't care lower row address of the refresh leveraging address to drive word lines according to a combined refresh leveraging address, the combined refresh leveraging address being formed of (i) the remaining address of the refresh leveraging address other than the don't care lower row address and (ii) an internally generated lower row address.

In example embodiments, the redundancy repair row address information includes information for selecting redundancy memory cells in a redundancy memory cell block of the semiconductor device, and the refresh leveraging address information includes information for selecting weak memory cells in the normal memory cell block.

In example embodiments, the redundancy repair row unit is formed of a four word line unit, and the lower row address is a 2-bit address.

In example embodiments, the semiconductor memory device includes a counter configured to generate the lower row address from a least significant bit address by sequentially incrementing the least significant bit address.

In example embodiments, the method may further comprise setting the unit of word lines of the refresh leveraging row driving unit to have the same number of word lines as a number of word lines of the redundancy repair row unit.

With embodiments of the inventive concepts, there may be provided a merit suitable for mass production of a semiconductor memory device. Also, as limitations of a test operation are solved, a write operation of a fail memory address may be simplified. It is possible to perform a redundancy repair operation and anti-fuse rupturing for a refresh leveraging address programming operation at once. Data analysis may be easy by fail bit merge. Since an additional monitoring item is unnecessary, a test time may be shortened.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 4 is a diagram illustrating a typical GRL address stored at an anti-fuse box, according to an example embodiment;

FIG. 5 is a diagram illustrating a GRL address stored at an anti-fuse box according to an example embodiment of the inventive concepts;

FIG. 6 is an operating timing diagram of general refresh leveraging of FIG. 4;

FIG. 7 is a diagram illustrating an operating timing of refresh leveraging of FIG. 5;

DETAILED DESCRIPTION

Figure 1:
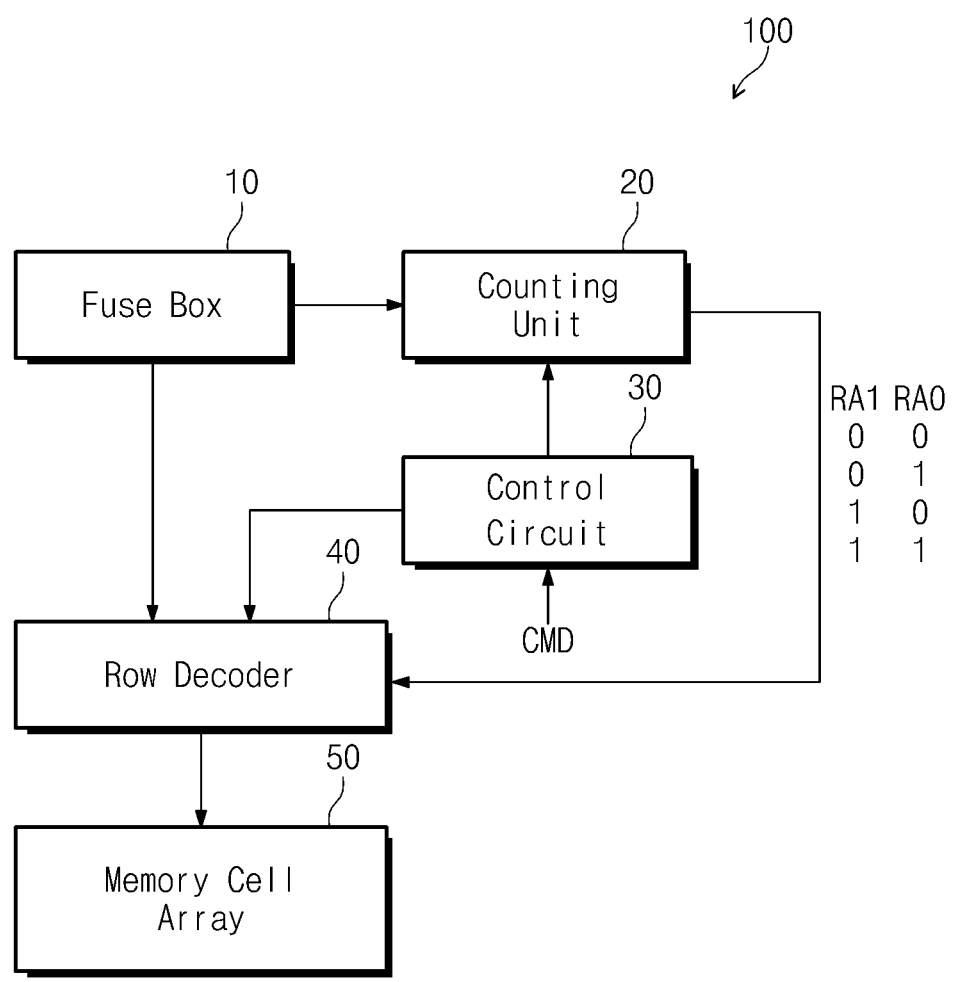
FIG. 1 is a block diagram schematically illustrating a semiconductor memory device according to an example embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that details of a fundamental data access operation, a refresh operation, an anti-fuse program and repair operation, and an internal function circuit associated with a DRAM may be skipped to prevent the inventive concepts from becoming ambiguous.

FIG. 1 is a block diagram schematically illustrating a semiconductor memory device according to an example embodiment of the inventive concepts.

Referring to FIG. 1, a semiconductor memory device 100 may include a fuse box 10, a counting unit 20, a control circuit 30, a row decoder 40, and a memory cell array 50.

The memory cell array 50 may include a normal cell block having normal memory cells connected with normal word lines and a spare cell block having redundancy memory cells connected with spare word lines. In the normal and redundancy cell blocks, a unit memory cell may be a DRAM memory cell formed of an access transistor and a storage capacitor. Each of the normal and redundancy cell blocks may include a plurality of memory cells arranged in a matrix form including rows and columns.

The fuse box 10 may store redundancy repair row address information for selecting redundancy memory cells of the redundancy memory cell block and refresh leveraging address information for selecting weak memory cells of the normal memory cell block. In some embodiments, the fuse box 10 may permanently store the repair row address information. The fuse box 10 may include a plurality of anti-fuses ruptured at programming. Fuses for storing the refresh leveraging address information may be implemented by anti-fuses.

The counting unit 20 may perform a count operation to generate an address internally. The counting unit 20 may generate a lower row address in an interleaving manner. The counting unit 20 may generate the lower row address from a least significant bit address by sequentially incrementing the least significant bit address In various embodiments, the counting unit 20 may generate the lower row address from a most significant bit address by sequentially decrementing the most significant bit address.

The row decoder 40 may select the word lines of the memory cell array 50. The row decoder 40 may decode a row address for selecting a row of memory cells to activate a normal word line or a spare word line In example embodiments, a unit of word lines to be driven at a refresh leveraging operation is set to be equal to a redundancy repair row unit and a lower row address of an input refresh leveraging address corresponding to a refresh leveraging row driving unit decided as "don't care". The term "don't-care" may refer to an input-sequence or a series of input bits that do not result in, or otherwise affect, an output sequence or series of output bits. The control circuit 30 is configured to control the counting circuit 20 to generate the don't care lower row address of the refresh leveraging address internally and control the row decoder 40 to drive word lines according to a combined refresh leveraging address formed of both the remaining address of the refresh leveraging address other than the don't care lower row address and the internally generated lower row address.

In embodiments where the redundancy repair row unit is formed of four word lines, the lower row address may be a 2-bit address.

In various embodiments, a unit of word lines may be driven at a refresh leveraging operation that is the same as a redundancy repair row unit. In such embodiments, the redundancy repair row unit may provide such a base that memory test processes are tested at once.

With the above description, a unit of word lines to be driven at a refresh leveraging operation may be decided to be the same as a redundancy repair row unit. For example, if the redundancy repair row unit is formed of four word lines, a unit of word lines to be driven at a refresh leveraging operation may be formed of four word lines.

Accordingly, a lower row address of a refresh leveraging address applied may be don't care to correspond to the refresh leveraging row driving unit decided. That is, if a unit of word lines to be driven at a refresh leveraging operation is formed of four word lines, two lower row address bits of the refresh leveraging address may be don't care Instead, the two lower row address bits "don't care" may be internally generated through the counting unit 20. Under the control of the control circuit 30, the row decoder 40 may drive the word lines according to a refresh leveraging address which is obtained by combing the remaining address of the refresh leveraging address other than the don't care lower row address and an internal address generated through the counting unit 20. Additionally, in various embodiments, under the control of the control circuit 30, the row decoder 40 may drive the word lines in synchronization with a refresh leveraging enable signal.

Figure 2:
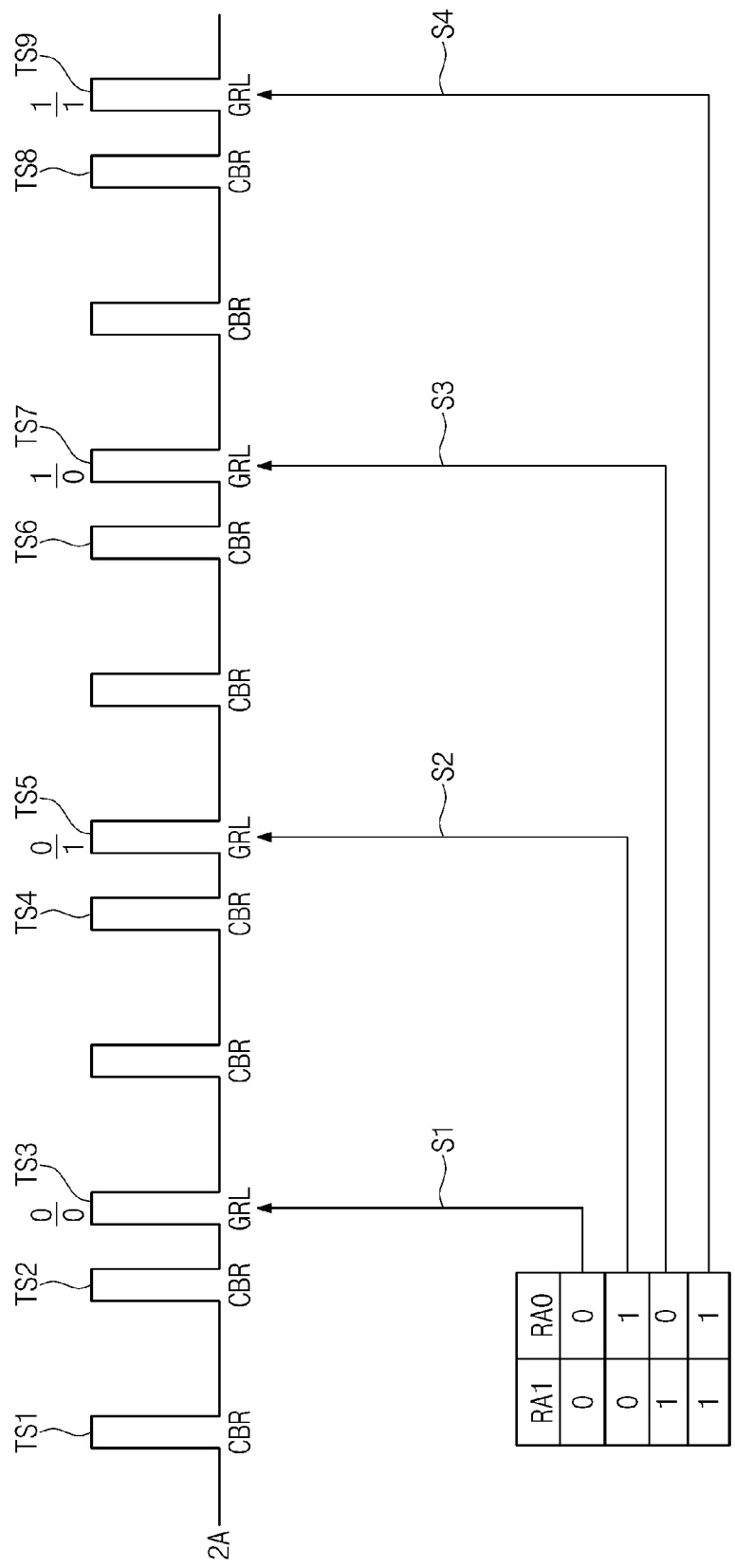
FIG. 2 is a timing diagram of refresh leveraging driving of FIG. 1.

FIG. 2 is a timing diagram of refresh leveraging driving of FIG. 1.

Referring to FIG. 2, each of operating periods TS1, TS2, TS4, TS6, and TS8 of a waveform 2A may indicate an operating period in which a CBR (CAS Before RAS) refresh operation is executed. Each of operating periods TS3, TS5, TS7, and TS9 may indicate an operating period in which GRL is executed. The CBR refresh operation may be a general refresh operation of a DRAM. FIG. 2 illustrates an example in which the number of word lines to be driven at the GRL operation is 4. However, the inventive concepts are not limited thereto. For example, 2, 6, or 8 word lines may be driven at the GRL operation. If a redundancy repair row unit is six word lines, a driving unit of the GRL may be formed of six word lines. If a redundancy repair row unit is two word lines, a driving unit of the GRL may be formed of two word lines. If a redundancy repair row unit is eighth word lines, a driving unit of the GRL may be formed of eighth word lines. Thus, in various embodiments, a number of word lines for a redundancy repair row lines may be equal to a number of word lines for a driving unit of the GRL.

In FIG. 2, the arrow marked by S1 shows that a GRL operation is executed at the operating period TS3 according to a refresh leveraging address formed of both the remaining address of a refresh leveraging address other than a don't care lower row address and two internal address bits '00' generated through a counting unit 20.

In FIG. 2, an arrow marked by S2 shows that a GRL operation is executed at the operating period TS5 according to a refresh leveraging address formed of both the remaining address of the refresh leveraging address other than the don't care lower row address and two internal address bits '01' generated through the counting unit 20.

In FIG. 2, an arrow marked by S3 shows that a GRL operation is executed at the operating period TS5 according to a refresh leveraging address formed of both the remaining address of the refresh leveraging address other than the don't care lower row address and two internal address bits '10' generated through the counting unit 20.

In FIG. 2, an arrow marked by S4 shows that a GRL operation is executed at the operating period TS5 according to a refresh leveraging address formed of both the remaining address of the refresh leveraging address other than the don't care lower row address and two internal address bits '11' generated through the counting unit 20.

It is understood from FIG. 2 that when a redundancy repair row unit is a 4 word line (WL) unit, word lines are driven by a unit of four word lines at the refresh leveraging operation.

The above-described GRL operation may provide a merit suitable for mass production of a volatile semiconductor memory device. Also, as limitations of a test operation are solved, a write operation of a fail memory address may be simplified. It is possible to perform a redundancy repair operation and anti-fuse rupturing for a refresh leveraging address programming operation at once. Data analysis may be easy by fail bit merge. Since an additional monitoring item is unnecessary, a test time may be shortened.

Example embodiments as described above describe an example in which the lower row address is generated from a least significant bit address sequentially in an increasing direction through the counter. However, the inventive concepts are not limited thereto. For example, the lower row address can be generated in an interleaving basis.

Figure 3:
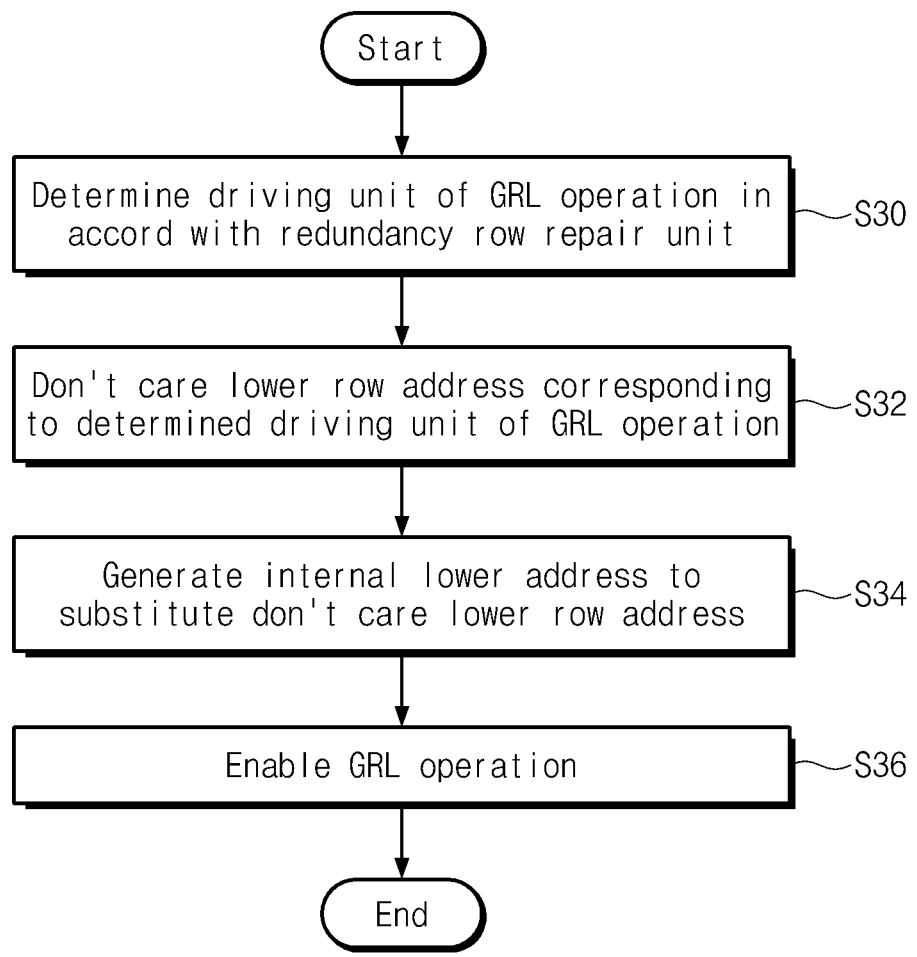
FIG. 3 is a flow chart illustrating a refresh leveraging driving method of a semiconductor memory device of FIG. 1.

FIG. 3 is a flow chart illustrating a refresh leveraging driving method of a semiconductor memory device of FIG. 1.

Referring to FIG. 3, in operation S30, a driving unit of a GRL operation is determined in accordance with a redundancy row repair unit. In various embodiments, a unit of word lines to be driven at a refresh leveraging operation may be decided to be the same or similar as a redundancy repair row unit. For example, if the redundancy repair row unit is formed of four word lines, the unit of word lines to be driven at the refresh leveraging operation may be formed of four word lines. If the redundancy repair row unit is formed of eighth word lines, the unit of word lines to be driven at the refresh leveraging operation may be formed of eighth word lines.

In operation S32, a lower row address of an input refresh leveraging address corresponding to the decided refresh leveraging row driving unit may be in a don't care state. In various embodiments, if the redundancy repair row unit is formed of four word lines, two lower row address bits RA0 and RA1 may be don't care.

In operation S34, an internal lower address is generated to substitute a don't care lower row address. In various embodiments, the don't care lower row address of the refresh leveraging address may be internally generated through a counting unit 20. That is, in such embodiments, the counting unit 20 may generate a 2-bit internal address "00", "01", "10", and "11", sequentially.

In operation S36, a GRL operation is enabled. In various embodiments, as the GRL operation is enabled, four word lines may be activated according to a combined refresh leveraging address as described with reference to FIG. 2.

FIG. 4 is a diagram illustrating a typical GRL address stored at an anti-fuse box. A first fuse box for GRL, GRL-F1 in a fuse box 10 of FIG. 1, may store a refresh leveraging address for activating a word line at a GRL operation. To store the refresh leveraging address, information on a word line may be programmed by rapturing anti-fuses in the first fuse box GRL-F1.

A second fuse box for GRL, GRL-F2, may store a refresh leveraging address for activating another word line at the GRL operation.

A third fuse box for GRL, GRL-F3, may store a refresh leveraging address for activating still another word line at the GRL operation. A fourth fuse box for GRL, GRL-F4, may store a refresh leveraging address for activating still another word line at the GRL operation.

It is understood from FIG. 4 that four GRL fuse boxes are used to activate four word lines at the GRL operation. In a typical GRL scheme, GRL driving may be performed by a word line unit.

In case of the inventive concepts, as illustrated in FIG. 5, a GRL fuse box may be used when GRL driving is performed by a unit of four word lines.

FIG. 5 is a diagram illustrating a GRL address stored at an anti-fuse box according to an example embodiment of the inventive concepts.

Referring to FIG. 5, a first fuse box for GRL, GRL-F1 in a fuse box 10 of FIG. 1, may store a refresh leveraging address for enabling word lines of weak memory cells. In this case, two lower address bits of the refresh leveraging address are don't care. This may mean that the first fuse box GRL-F1 stores a refresh leveraging address for activating four word lines at the GRL operation.

FIG. 6 is an operating timing diagram of general refresh leveraging of FIG. 4.

Referring to a box A marked by a dotted line, a word line corresponding to a refresh leveraging address stored at a first fuse box for GRL, GRL-F1 of FIG. 4, may be enabled at GRL driving. Referring to a box B marked by a dotted line, a word line corresponding to a refresh leveraging address stored at a second fuse box for GRL, GRL-F2 of FIG. 4, may be enabled at the GRL driving. Referring to a box C marked by a dotted line, a word line corresponding to a refresh leveraging address stored at a third fuse box for GRL, GRL-F3 of FIG. 4, may be enabled at the GRL driving. Referring to a box D marked by a dotted line, a word line corresponding to a refresh leveraging address stored at a fourth fuse box for GRL, GRL-F4 of FIG. 4, may be enabled at the GRL driving.

In FIG. 6, a waveform REF may indicate a refresh enable pulse, a waveform PRD may indicate a word line selection enable pulse generated through decoding of a row decoder 40. A waveform LEV_EN may indicate a GRL enable pulse. In general, CBR refreshing may be simultaneously performed at all memory banks, while a GRL operation may be performed at a selected memory bank.

FIG. 7 is a diagram illustrating an operating timing of refresh leveraging of FIG. 5.

Referring to a box A1 marked by a dotted line in FIG. 7, at GRL driving, a word line may be enabled according to a combined refresh leveraging address which is formed of the remaining address A14-A2 of a refresh leveraging address, stored at a first fuse box for GRL, GRL-F1, other than a don't care lower row address A0 and A0 and an internal 2-bit address "00" generated through a counting unit 20. Thus, a word line corresponding to the combined refresh leveraging address may be activated during a period PU1.

Referring to a box A2 marked by a dotted line in FIG. 7, at the GRL driving, a word line may be enabled according to a combined refresh leveraging address which is formed of the remaining address A14-A2 of the refresh leveraging address, stored at a first fuse box for GRL, GRL-F1, other than the don't care lower row address A1 and A0 and an internal 2-bit address "01" generated through the counting unit 20. Thus, a word line corresponding to the combined refresh leveraging address may be activated during a period PU2.

Referring to a box A3 marked by a dotted line in FIG. 7, at the GRL driving, a word line may be enabled according to a combined refresh leveraging address which is formed of the remaining address A14-A2 of the refresh leveraging address, stored at a first fuse box for GRL, GRL-F1, other than the don't care lower row address A1 and A0 and an internal 2-bit address "10" generated through the counting unit 20. Thus, a word line corresponding to the combined refresh leveraging address may be activated during a period PU3.

Referring to a box A4 marked by a dotted line in FIG. 7, at the GRL driving, a word line may be enabled according to a combined refresh leveraging address which is formed of the remaining address A14-A2 of the refresh leveraging address, stored at a first fuse box for GRL, GRL-F1, other than the don't care lower row address A1 and A0 and an internal 2-bit address "11" generated through the counting unit 20. Thus, a word line corresponding to the combined refresh leveraging address may be activated during a period PU4.

In FIG. 7, a waveform REF may indicate a refresh enable pulse, a waveform PRD may indicate a word line selection enable pulse generated through decoding of a row decoder 40. A waveform LEV_EN may indicate a GRL enable pulse. A word line connected with substantially weak memory cells may be activated for the GRL scheme during at least one of the periods PU1 to PU4. That is, when four word lines are activated, three word lines of the four word lines activated may be activated in dummy.

In FIG. 7, "Nom" may indicate a normal refresh operation (e.g., an auto-refresh operation). "Nom & Table" may indicate a normal refresh operation and a GRL refresh operation. As understood from a waveform PRD, eight word lines may be enabled by a "Nom" pulse for a refresh operation every bank. Also, eight word lines in a selected bank may be enabled by a "Nom & Table" pulse for a refresh operation, and a word line may be enabled for a refresh operation when a "LEV_EN" pulse is enabled. As a result, four word lines may be activated for GRL refreshing within a given refresh cycle. This may mean that the GRL refreshing is performed by the same unit as a redundancy repair row unit (in case of a unit of four word lines).

If a word line enable unit for a GRL operation is set to be the same as a redundancy repair row unit, a test time may be reduced.

Figure 8:
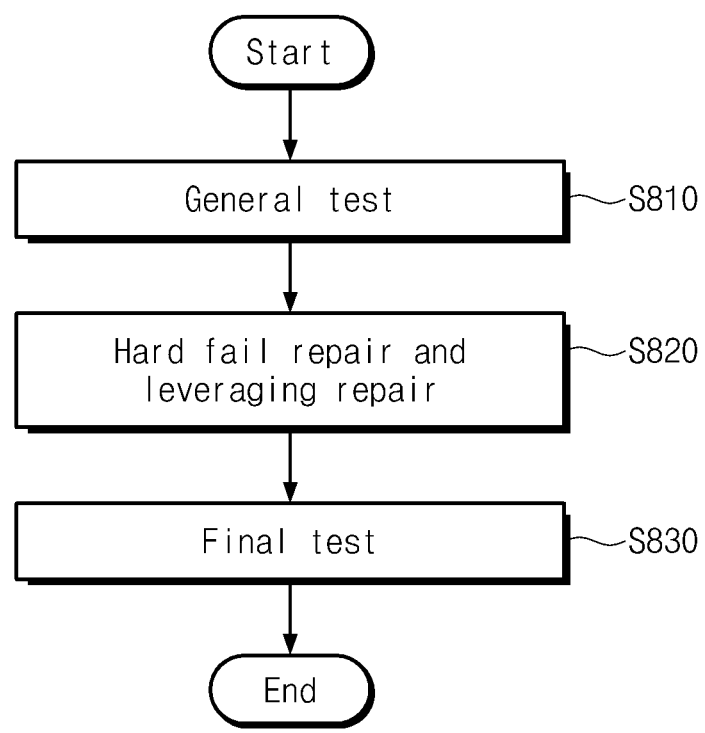
FIG. 8 is a flow chart for describing a decrease in a test time according to an example embodiment of the inventive concepts.

FIG. 8 is a flow chart for describing a decrease in a test time according to an example embodiment of the inventive concepts.

FIG. 8 illustrates test operations executed when a word line enable unit for a GRL operation is set to be the same as a redundancy repair row unit. A test process of FIG. 8 may include general test S810, hard fail repair and refresh leveraging repair S820, and final test S830.

According to various embodiments, if the general test S810, such as cold test or hot test is performed, hard fail repair and refresh leveraging repair may be instantly performed in operation S820. A 4WL unit of hard fail repair and a 4WL unit of refresh leveraging repair may be performed at once. As a result, it is possible to perform a redundancy repair operation and anti-fuse rupturing for a refresh leveraging address programming operation at once.

Thus, there may be provided a merit suitable for mass production of a volatile semiconductor memory device. Also, as limitations of a test operation are solved, a write operation of a fail memory address may be simplified.

Figure 9:
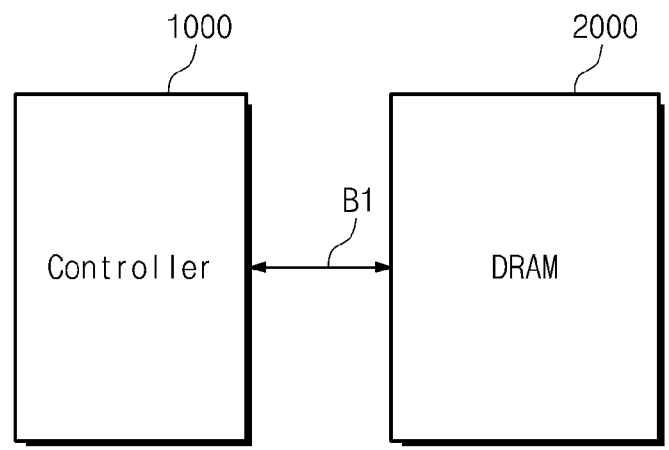
FIG. 9 is a block diagram schematically illustrating a memory system according to an example embodiment of the inventive concepts.

FIG. 9 is a block diagram schematically illustrating a memory system according to an example embodiment of the inventive concepts.

Referring to FIG. 9, a memory system may include a controller 1000 and a dynamic random access memory 2000.

The controller 1000 may be connected with a host (not shown) through a given interface.

The dynamic random access memory 2000 is configured to be the same or similar to the semiconductor device 100 as illustrated in FIG. 1.

Thus, in the memory system, since a unit of word lines to be driven at a refresh leveraging operation is set to be the same as a redundancy repair row unit, a test time may be reduced and the DRAM 2000 may be suitable for mass production. Accordingly, a cost for implement of the memory system may be reduced.

Figure 10:
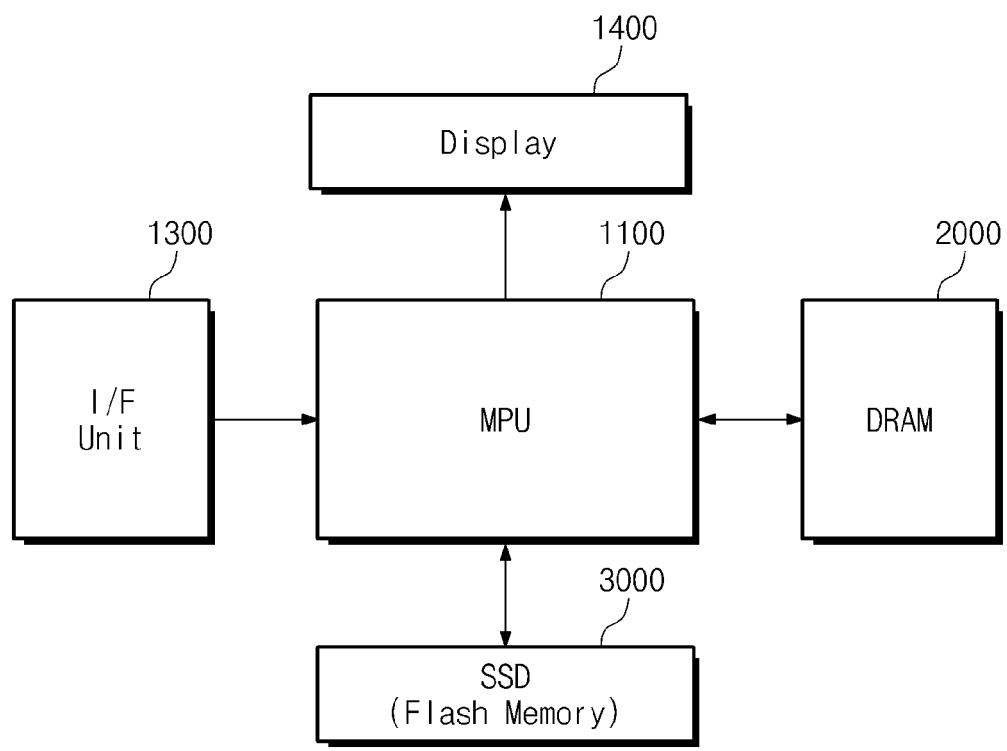
FIG. 10 is a block diagram schematically illustrating a mobile device according to an example embodiment of the inventive concepts.

FIG. 10 is a block diagram schematically illustrating a mobile device according to an example embodiment of the inventive concepts.

Referring to FIG. 10, a mobile device may be a notebook or a handheld electronic device, and may include a micro processing unit (MPU) 1100, an interface unit 1300, a display 1400, a DRAM 2000, and a solid state drive 3000.

In some embodiments, the MPU 1100, the DRAM 2000, and the SSD 3000 may be provided in the form of a package or integrated to a chip. This may mean that the DRAM 2000 and the SSD 3000 are embedded in ae mobile device.

If the mobile device is a portable communications device, the interface unit 1300 may be connected with a modem and transceiver block which is configured to perform a communication data transmitting and receiving function and a data modulating and demodulating function.

The MPU 1100 is configured to control an overall operation of the mobile device according to a given program.

The DRAM 2000 may be connected with the MPU 1100 through a system bus, and may be used as a buffer memory or a main memory of the MPU 1100.

Since a unit of word lines to be driven at a refresh leveraging operation is set to be the same as a redundancy repair row unit, a test time may be reduced and the DRAM 2000 may be suitable for mass production. Accordingly, a cost for implement of the mobile device may be reduced.

The SSD 3000 may include a NOR or NAND flash memory.

The display 1400 may have a liquid crystal having a backlight, a liquid crystal having an LED light source, or a touch screen (e.g., OLED). The display 1400 may function as an output device for displaying images (e.g., characters, numbers, pictures, etc.) in color.

The mobile device may be a mobile communications device. In some cases, the mobile device may function as a smart card by adding or removing components to or from the mobile device.

In case of the mobile device, a separate interface may be connected with an external communications device. The communications device may be a DVD player, a computer, a set top box (STB), a game machine, a digital camcorder, or the like.

Although not shown in FIG. 10, the mobile device may further include an application chipset, a camera image processor (CIS), a mobile DRAM, and/or other like components.

FIG. 10 illustrates an example in which a flash memory is used. However, a variety of nonvolatile storages may be used.

The nonvolatile storage may store data information having various data formats such as a text, a graphic, a software code, and/or other like data types.

The nonvolatile storage may be formed of EEPROM (Electrically Erasable Programmable Read-Only Memory), flash memory, MRAM (Magnetic RAM), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

Figure 11:
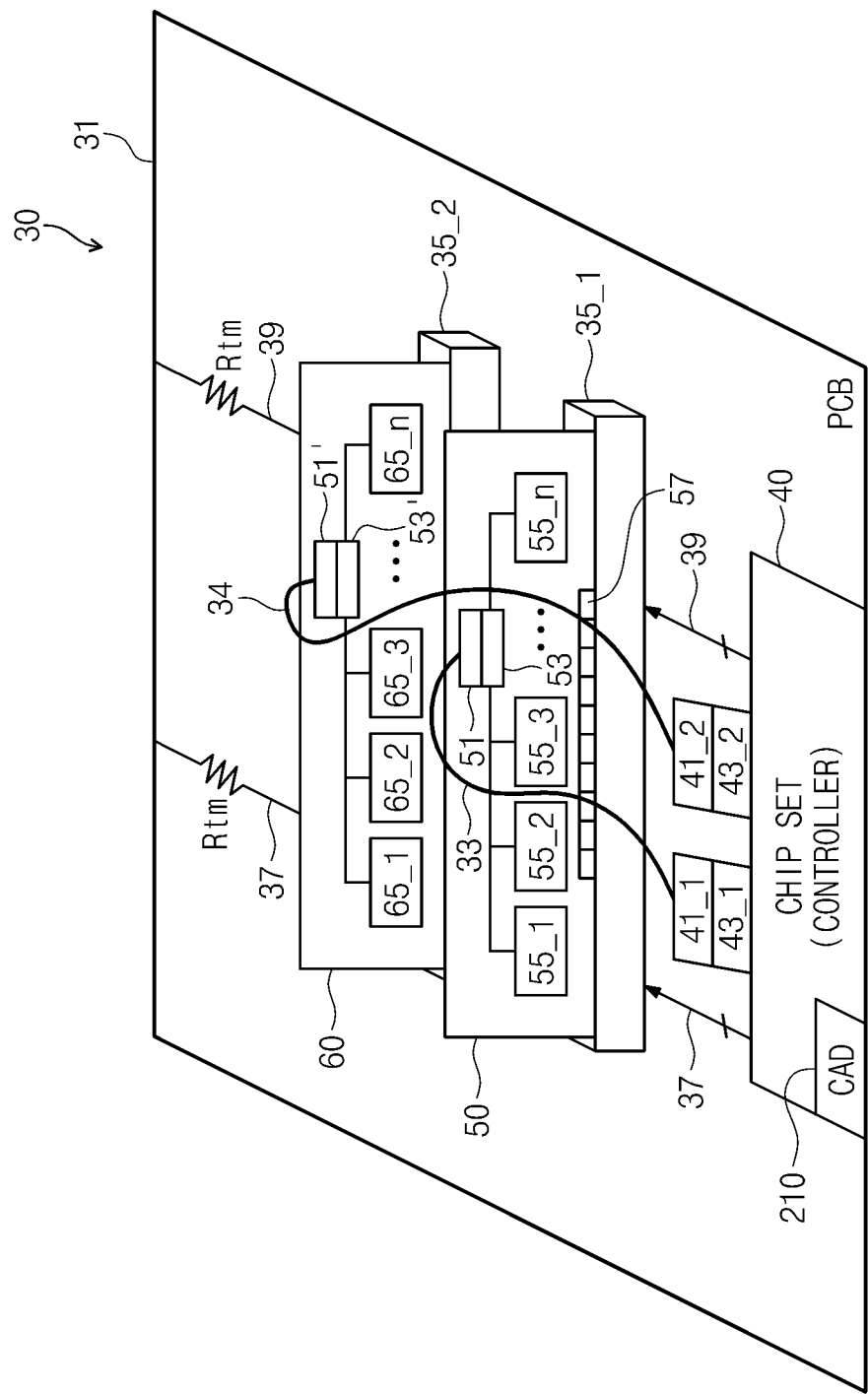
FIG. 11 is a block diagram schematically illustrating an application of an example embodiment of the inventive concepts applied to an optical I/O scheme.

FIG. 11 is a block diagram schematically illustrating an application of an example embodiment of the inventive concepts applied to an optical I/O scheme. Referring to FIG. 11, a memory system 30 with high-speed optical input/output may include a chipset 40 configured as a controller and memory modules 50 and 60 mounted on a PCB substrate 31. The memory modules 50 and 60 may be inserted in slots 35_1 and 35_2 installed on the PCB substrate 31. The memory module 50 may include a connector 57, DRAM memory chips 55_1 to 55_n, an optical I/O input unit 51, and an optical I/O output unit 53.

The optical I/O input unit 51 may include a photoelectric conversion element (e.g., a photodiode) configured to convert an input optical signal into an electrical signal. The electrical signal output from the photoelectric conversion element may be received by the memory module 50. The optical I/O output unit 53 may include an electro-photic conversion element (e.g., a laser diode) configured to convert an electrical signal output from the memory module 50 into an optical signal. In some cases, the optical I/O output unit 53 may further include an optical modulator to modulate a signal output from a light source.

An optical cable 33 is configured to perform optical communications between the optical I/O input unit 51 of the memory module 50 and an optical transmission unit 41_1 of the chipset 200. The optical communications may have a bandwidth (e.g., gigabits per second). The memory module 50 may receive signals or data from signal lines 37 and 39 of the chipset 200 through the connector 57, and may perform high-speed data communications with the chipset 200 through the optical cable 33. Meanwhile, resistors Rtm installed at lines 37 and 39 may be termination resistors.

The DRAM memory chips 55-1 to 55-n according to an embodiment of the inventive concepts may be applied to the memory system 30 with the optical I/O structure.

Thus, in the memory system 30, since a unit of word lines to be driven at a refresh leveraging operation is set to be the same as a redundancy repair row unit, a test time may be reduced and the DRAM memory chips 55-1 to 55-n may be suitable for mass production. Accordingly, a cost for implement of the memory system may be reduced.

In FIG. 11, the chipset 40 may include a concentration access detecting unit 210. The concentration access detecting unit 210 is configured to generate a concentration access detection signal when an input frequency of a frequently applied address exceeds a threshold value.

When the concentration access detection signal is generated, the chipset 40 may prevent, inhibit, or alleviate corruption of data of memory cells adjacent to a specific memory area.

For example, intensively accessing a specific word line, bit line, or memory block of a volatile semiconductor memory (e.g., DRAM) may cause corruption of cell data. That is, cell data of memory cells of word lines adjacent to a specific word line, bit lines adjacent to a specific bit line, or a memory block adjacent to a specific memory block may be lost due to a concentration access. It may be advantageous to prevent, inhibit, or alleviate a loss of cell data by solving or avoid address concentration.

In the case that the DRAM memory chips 55-1 to 55-n of the memory modules 50 and 60 are accessed by a memory page unit, a column unit or a bank unit, the concentration access detecting unit 210 may monitor access concentration.

In the case that a memory system of FIG. 11 is an SSD, the DRAM memory chips 55_1 to 55_n may be used as a user data buffer.

Figure 12:
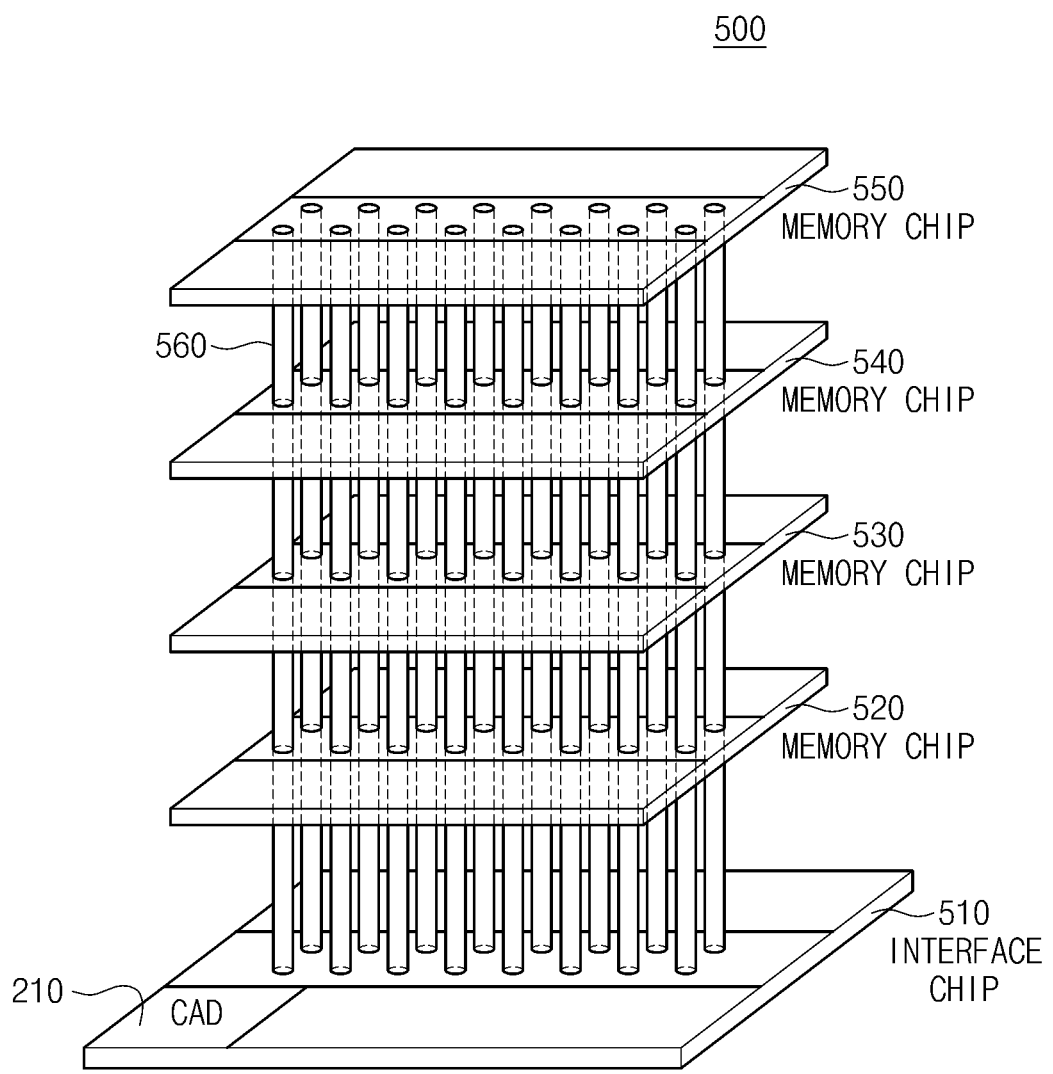
FIG. 12 is a diagram schematically illustrating an application of an example embodiment of the inventive concepts to which through-silicon via (TSV) is applied.

FIG. 12 is a diagram schematically illustrating an application of an example embodiment of the inventive concepts to which through-silicon via (TSV) is applied.

Referring to a stack type memory device 500 in FIG. 12, a plurality of memory chips 520, 530, 540, and 550 may be stacked on an interface chip 510 in a vertical direction. A plurality of through-silicon vias 560 may be formed to penetrate the memory chips 520, 530, 540, and 550. Mass data may be stored at the three-dimensional stack package type memory device 500 including the memory chips 520, 530, 540, and 550 stacked on the interface chip 510 in a vertical direction. Also, the three-dimensional stack package type memory device 500 may be advantageous for high speed, low power and scale-down.

The interface chip 510 may include a concentration access detecting unit 210, so that corruption of data in the memory chips 520, 530, 540, and 550 is prevented or alleviated.

DRAMs according to an example embodiment of the inventive concepts may be applied to the stack type memory device of FIG. 12. Thus, since a unit of word lines to be driven at a refresh leveraging operation is set to be the same as a redundancy repair row unit, a test time may be reduced and DRAMs constituting the memory chips 520, 530, 540, and 550 may be suitable for mass production. Accordingly, a cost for implement of the stack type memory device may be reduced.

Figure 13:
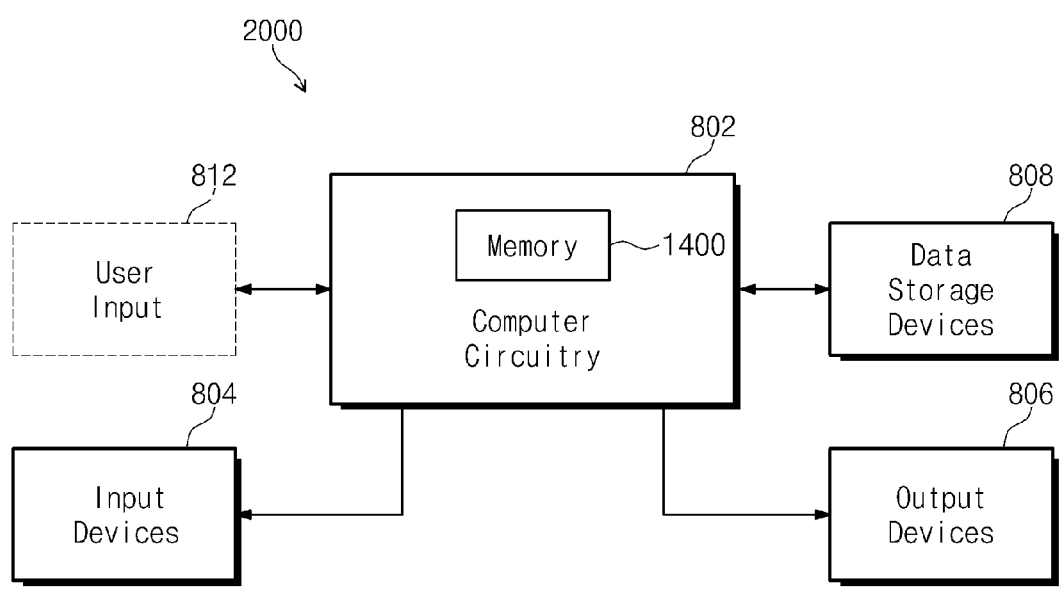
FIG. 13 is a block diagram schematically illustrating an application of an example embodiment of the inventive concepts applied to a data processing device.

FIG. 13 is a block diagram schematically illustrating an application of an example embodiment of the inventive concepts applied to a data processing device.

Referring to FIG. 13, a data processing device 2000 may include a computer circuit 802 having a memory 1400, input devices 804, output devices 806, and data storage devices 808. Also, the data processing device 2000 may further comprise a user input unit 812 for user convenience. The user input unit 812 may include a number key, a function key, and so on, and may provide an interface between the data processing device and a user.

The memory 1400 of the data processing device 2000 may be formed of a DRAM according to an example embodiment of the inventive concepts. Thus, a cost required to manufacture the data processing device 2000 may be reduced.

Figure 14:
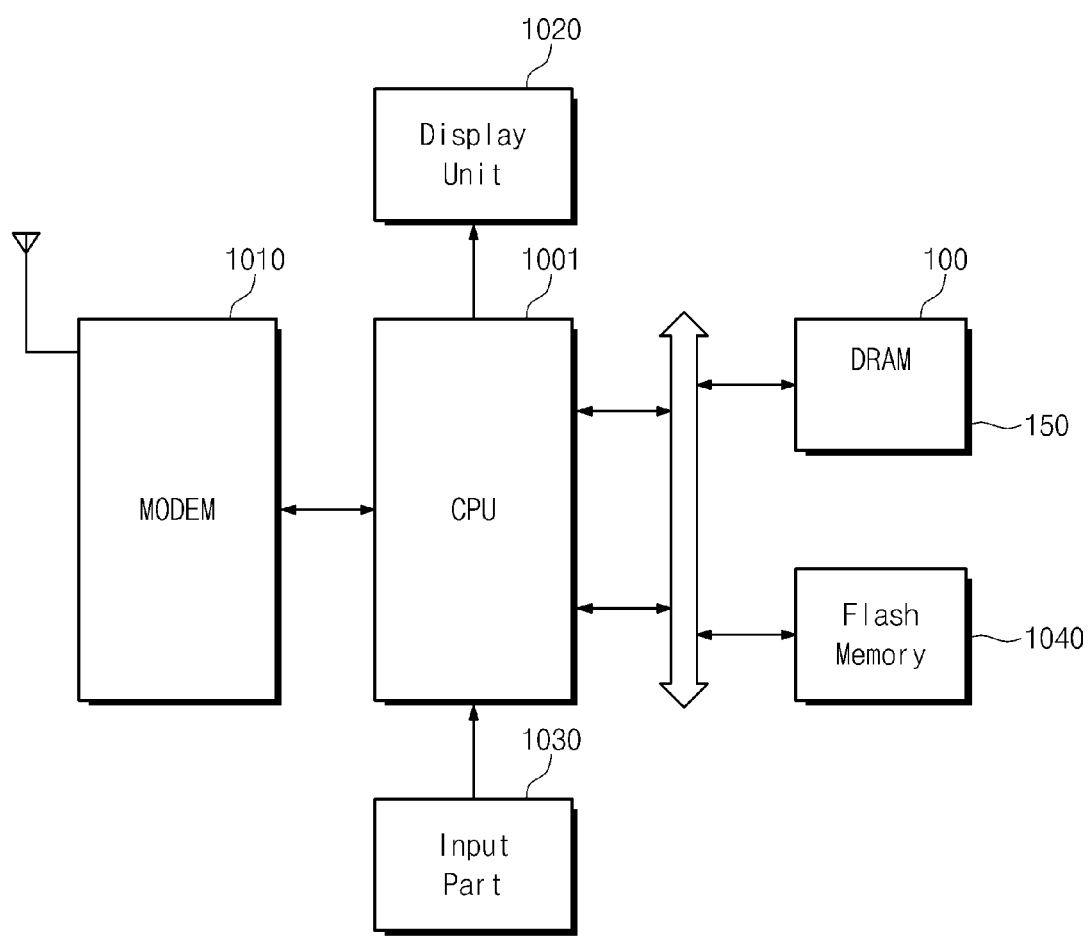
FIG. 14 is a block diagram schematically illustrating a mobile device according to an example embodiment of the inventive concepts.

FIG. 14 is a block diagram schematically illustrating a mobile device according to an embodiment of the inventive concepts.

Referring to FIG. 14, a mobile device may include a modem block 1010, a CPU 1001, a DRAM 100, a flash memory 1040, a display unit 1020, and an input part 1030.

In some cases, the CPU 1001, the DRAM 100, and the flash memory 1040 may be provided in the form of a package or integrated to a chip.

The modem block 1010 is configured to perform a communication data modulating and demodulating function.

The CPU 1001 is configured to control an overall operation of the mobile device according to a predetermined program.

The DRAM 100 may be used as a main memory of the CPU 1001, and may be a synchronous DRAM.

The flash memory 1040 may be a NOR or NAND flash memory.

The display unit 1020 may have a liquid crystal having a backlight, a liquid crystal having an LED light source, or a touch screen (e.g., OLED). The display unit 1020 may be an output device for displaying images (e.g., characters, numbers, pictures, etc.) in color.

The input part 1030 may be an input device including number keys, function keys, and on the like, and may provide an interface between the mobile device and a user.

The DRAM 100 is configured the same or similar to semiconductor device 100 as described with reference to FIG. 1. Thus, a cost for implement of the DRAM 100 may be reduced. This may mean that price competitiveness of the mobile device is intensified.

According to various embodiments of the inventive concepts, the mobile device may be a mobile communications device. In some cases, the mobile device may function as a smart card or a solid state driver by adding or removing components to or from the mobile device.

In case of the mobile device, a separate interface may be connected with an external communications device. The communications device may be a DVD player, a computer, a set top box (STB), a game machine, a digital camcorder, or other like devices.

Although not shown in FIG. 14, the mobile device may further include an application chipset, a camera image processor (CIS), a mobile DRAM, and the like.

A chip in the mobile device may be packed using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

FIG. 14 illustrates an example in which a flash memory is used. However, according to various embodiments, a variety of nonvolatile storages may be used.

The nonvolatile storage may store data information having various data formats such as a text, a graphic, a software code, and so on.

While the inventive concepts has been described with reference to exemplary embodiments, it will be apparent to those skilled in the art that various changes and modifications may be made without departing from the spirit and scope of the present invention. Therefore, it should be understood that the above embodiments are not limiting, but illustrative. For example, a circuit constitution of FIG. 1 may be modified, or a unit of word lines to be driven at a refresh leveraging operation may be changed according to a redundancy repair row unit changed. Also, a unit of word lines to be driven at a refresh leveraging operation may be changed, increased or decreased by an external command, a fuse option, or a metal option. The inventive concepts may be applied to all semiconductor memory devices necessitating a leveraging scheme.

What is claimed is:

1. A refresh leveraging driving method, comprising:
    setting, by a semiconductor device, a unit of word lines of a refresh leveraging row driving unit to have the same number of word lines as a number of word lines of a redundancy repair row unit;
    setting, by the semiconductor device, a lower row address of an input refresh leveraging address to a don't care state, the lower row address corresponding to the refresh leveraging row driving unit; and
    generating, by the semiconductor device, a don't care lower row address of the refresh leveraging address to drive word lines according to a combined refresh leveraging address, the combined refresh leveraging address being formed of (i) a remaining address of the refresh leveraging address other than the don't care lower row address and (ii) an internally generated lower row address.

2. The refresh leveraging driving method of claim 1, wherein the redundancy repair row unit is formed of a four word line unit, and the lower row address is a 2-bit address.

3. The refresh leveraging driving method of claim 1, wherein the redundancy repair row unit is formed of an eight word line unit, and the lower row address is a 3-bit address.

4. The refresh leveraging driving method of claim 1, wherein the lower row address is generated by a counting operation of an internal counter.

5. The refresh leveraging driving method of claim 1, wherein the lower row address is generated from a least significant bit address by sequentially incrementing the least significant bit address.

6. The refresh leveraging driving method of claim 1, wherein the lower row address is generated from a most significant bit address by sequentially decrementing the most significant bit address.

7. The refresh leveraging driving method of claim 1, wherein the lower row address is generated in an interleaving basis.

8. The refresh leveraging driving method of claim 1, wherein the word lines are driven in synchronization with a refresh leveraging enable signal.

9. The refresh leveraging driving method of claim 1, wherein the input refresh leveraging address is stored at an anti-fuse box.

10. A method for driving a refresh leveraging operation of semiconductor memory device, the method comprising:
- storing, by the semiconductor memory device, a redundancy repair row address and a refresh leveraging address;
- selecting, by the semiconductor memory device, a word line unit of a memory cell array of the semiconductor device, the word line unit being located at the stored refresh leveraging address, the word line unit having an equal number of word lines as a number of word lines of a redundancy repair row unit located at the stored redundancy repair row address, and a lower row address of an input refresh leveraging address corresponding to a refresh leveraging row driving unit is in a don't care state; and
- generating, by the semiconductor memory device, a don't care lower row address of the refresh leveraging address to drive word lines according to a combined refresh leveraging address, the combined refresh leveraging address being formed of (i) the remaining address of the refresh leveraging address other than the don't care lower row address and (ii) an internally generated lower row address.

11. The method of claim 10, wherein the redundancy repair row address includes information for selecting redundancy memory cells in a redundancy memory cell block of the semiconductor device, and the refresh leveraging address includes information for selecting weak memory cells in the normal memory cell block.

12. The method of claim 11, wherein the redundancy repair row unit is formed of a four word line unit, and the lower row address is a 2-bit address.

13. The semiconductor memory device of claim 11, wherein the semiconductor memory device includes a counter configured to generate the lower row address from a least significant bit address by sequentially incrementing the least significant bit address.

14. The method of claim 10, further comprising:

setting the unit of word lines of the refresh leveraging row driving unit to have the same number of word lines as a number of word lines of the redundancy repair row unit.

* * * * *